US010460851B2

(12) United States Patent
Kamiga et al.

(10) Patent No.: US 10,460,851 B2
(45) Date of Patent: Oct. 29, 2019

(54) SILVER-TELLURIUM-COATED GLASS POWDER, PRODUCTION METHOD FOR SILVER-TELLURIUM-COATED GLASS POWDER, CONDUCTIVE PASTE, AND PRODUCTION METHOD FOR CONDUCTIVE PASTE

(71) Applicant: DOWA Electronics Materials Co., Ltd., Chiyoda-ku, Tokyo (JP)

(72) Inventors: Hiroshi Kamiga, Tokyo (JP); Taro Nakanoya, Tokyo (JP); Noriaki Nogami, Tokyo (JP); Kenichi Harigae, Tokyo (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 15/762,766

(22) PCT Filed: Mar. 15, 2017

(86) PCT No.: PCT/JP2017/010548
§ 371 (c)(1),
(2) Date: Mar. 23, 2018

(87) PCT Pub. No.: WO2017/159762
PCT Pub. Date: Sep. 21, 2017

(65) Prior Publication Data
US 2019/0080815 A1    Mar. 14, 2019

(30) Foreign Application Priority Data

Mar. 18, 2016 (JP) ................. 2016-055980
Aug. 19, 2016 (JP) ................. 2016-161348
Mar. 14, 2017 (JP) ................. 2017-048982

(51) Int. Cl.
| H01B 1/22 | (2006.01) |
| C03C 17/06 | (2006.01) |
| C03C 3/12 | (2006.01) |
| H01L 31/0224 | (2006.01) |
| C03C 3/32 | (2006.01) |
| C03C 8/02 | (2006.01) |
| C03C 8/16 | (2006.01) |
| C03C 8/18 | (2006.01) |
| C03C 17/10 | (2006.01) |
| H01L 31/18 | (2006.01) |

(52) U.S. Cl.
CPC ............. *H01B 1/22* (2013.01); *C03C 3/122* (2013.01); *C03C 3/321* (2013.01); *C03C 8/02* (2013.01); *C03C 8/16* (2013.01); *C03C 8/18* (2013.01); *C03C 17/06* (2013.01); *C03C 17/10* (2013.01); *H01L 31/022425* (2013.01); *C03C 2217/256* (2013.01); *C03C 2217/268* (2013.01); *C03C 2217/27* (2013.01); *H01L 31/1804* (2013.01); *Y02E 10/50* (2013.01); *Y02P 70/521* (2015.11)

(58) Field of Classification Search
CPC .............. H01B 1/22; H01L 31/022425; H01L 31/1804; C03C 3/122; C03C 17/06; C03C 2217/256; C03C 2217/268; Y02E 10/50; Y02P 70/521
USPC ......................................... 252/514
See application file for complete search history.

(56) References Cited

U.S. PATENT DOCUMENTS

| 9,039,937 B1 * | 5/2015 | Jung ................. C09D 5/24 252/500 |
| 10,030,156 B2 * | 7/2018 | Takagi ............... C09D 5/24 |
| 2011/0095240 A1 | 4/2011 | Nakamura et al. |
| 2014/0021417 A1 * | 1/2014 | Koike .................... H01B 1/22 252/514 |
| 2015/0191609 A1 | 7/2015 | Park et al. |
| 2015/0280024 A1 * | 10/2015 | Song .............. H01L 31/02242 136/256 |
| 2015/0318419 A1 * | 11/2015 | Hayashi ........... H01L 31/02242 438/608 |
| 2015/0357490 A1 | 12/2015 | Park et al. |
| 2018/0033897 A1 * | 2/2018 | Kanasaku ............. H01B 1/22 |
| 2018/0272425 A1 * | 9/2018 | Nogami ............... B22F 1/025 |

(Continued)

FOREIGN PATENT DOCUMENTS

| CN | 102081986 | 6/2011 | |
| EP | 2903034 A1 * | 8/2015 | .............. H01B 1/22 |
| EP | 3270421 | 1/2018 | |
| JP | 2011-096747 | 5/2011 | |
| JP | 2014-022194 | 2/2014 | |
| JP | 2014-164994 | 9/2014 | |
| JP | 2014-207262 | 10/2014 | |

(Continued)

OTHER PUBLICATIONS

Korean Intellectual Property Office, Korean Office Action in corresponding Korean Application No. 10-2018-7009679, dated Aug. 6, 2018.

*Primary Examiner* — Douglas J MC Ginty
(74) *Attorney, Agent, or Firm* — Carmody Torrance Sandak & Hennessey LLP (57) ABSTRACT

Provided is a silver-tellurium-coated glass powder including: a tellurium-based glass powder containing tellurium in an amount of 20% by mass or more; and a coating layer on a surface of the tellurium-based glass powder, the coating layer containing silver and tellurium as a main component. Preferable aspects include an aspect where the coating layer containing silver and tellurium as a main component further contains a component that is other than silver and tellurium and contained in the tellurium-based glass powder, and an aspect where the component that is lo other than silver and tellurium and contained in the tellurium-based glass powder contains one or more kinds selected from zinc, lead, bismuth, silicon, lithium, and aluminum.

12 Claims, 4 Drawing Sheets

(56) References Cited

U.S. PATENT DOCUMENTS

2019/0027620 A1* 1/2019 Kamiga ............ H01L 31/02242

FOREIGN PATENT DOCUMENTS

| KR | 10-2014-0092745 | 7/2014 |
| KR | 10-2015-0146105 | 12/2015 |
| TW | 201527244 | 7/2015 |
| WO | 2016/147867 | 9/2016 |

* cited by examiner

Silver-coated glass powder (Example 5)
450°C                          500°C

FIG. 6

Silver powder (AG-3-96F)+glass powder (Comparatice Example 5)=10:90 mixture by mass
450°C                          500°C

SILVER-TELLURIUM-COATED GLASS POWDER, PRODUCTION METHOD FOR SILVER-TELLURIUM-COATED GLASS POWDER, CONDUCTIVE PASTE, AND PRODUCTION METHOD FOR CONDUCTIVE PASTE

TECHNICAL FIELD

The present invention relates to: a silver-tellurium-coated glass powder suitable as a paste material for an electrode of a solar cell; a method for producing the silver-tellurium-coated glass powder; a conductive paste; and a method for producing the conductive paste.

BACKGROUND ART

Conventionally, a conductive paste containing, for example, a silver powder, a binder, a solvent, and a glass frit has been used. The conductive paste is required to have high conductivity as its property.

Under such circumstances, a conductive paste for an electrode of a solar cell has been proposed, where the conductive paste uses as a glass frit a tellurium-based glass frit (hereinafter may also be referred to as "a tellurium-based glass powder") containing a tellurium oxide to reduce contact resistance and provides good solar cell characteristics (see, for example, PTL 1).

Also, the present inventors have proposed a silver-coated glass powder where silver is coated on glass particles, and a method for producing the silver-coated glass powder (see, for example, PTL 2).

CITATION LIST

Patent Literature

PTL 1: Japanese Patent Application Laid-Open (JP-A) No. 2011-96747
PTL 2: JP-A No. 2014-164994

SUMMARY OF INVENTION

Technical Problem

As applications for an electrode of a solar cell, there is a demand for a paste material and a conductive paste for a solar cell electrode, where the paste material and the conductive paste further reduce contact resistance and provide good solar cell characteristics.

The present invention solves the above existing problems and aims to achieve the following object. Specifically, an object of the present invention is to provide: a silver-tellurium-coated glass powder capable of improving power generation efficiency (hereinafter may also be referred to as conversion efficiency) of a solar cell when used for an electrode of a solar cell; a method for producing the silver-tellurium-coated glass powder; a conductive paste containing the silver-tellurium-coated glass powder; and a method for producing the conductive paste.

Solution to Problem

The glass particles exemplified by the present inventors in the above JP-A No. 2014-164994 (PTL 2) are glass containing Bi-based components and Zn-based components as a main component. The glass containing Bi-based components and Zn-based components as a main component enables deposition (reduction reaction) of silver as a simple substance on the glass surface in a silver coating treatment based on the process described in the above JP-A No. 2014-164994, and enables a stable silver coating treatment of coating the glass with a silver layer. In tellurium-based glass powder containing tellurium easily dissolvable in an acid or an alkali, however, it is not possible to predict whether the silver coating treatment is possible. As a result, there has been no motivation to conduct the silver coating treatment on the tellurium-based glass powder that has a risk of starting to dissolve.

In view of this, the present inventors tried silver coating on the tellurium-based glass powder and found that silver coating on the tellurium-based glass powder with a silver layer was not possible. When evaluating a tellurium-based glass powder obtained by a specific treatment, however, the present inventors have found that there is an effect of improving power generation efficiency of a solar cell.

The present inventors conducted extensive studies based on the above finding and as a result have found the problems are solved by the following paste material and the following conductive paste using the paste material.

Specifically, a silver-tellurium-coated glass powder of the present invention contains a tellurium-based glass powder containing tellurium in an amount of 20% by mass or more, and a coating layer on a surface of the tellurium-based glass powder, the coating layer containing silver and tellurium as a main component.

In this case, preferably, the coating layer containing silver and tellurium as a main component further contains a component that is other than silver and tellurium and contained in the tellurium-based glass powder. More preferably, the component that is other than silver and tellurium and contained in the tellurium-based glass powder contains one or more kinds selected from zinc, lead, bismuth, silicon, lithium, and aluminum. Still s more preferably, a thickness of the coating layer containing silver and tellurium as a main component is 10 nm or more but 200 nm or less. Particularly preferably, an oxygen content of the coating layer containing silver and tellurium as a main component is less than an average of an oxygen content of the tellurium-based glass powder to be coated with the coating layer.

Also, the silver-tellurium-coated glass powder of the present invention is preferably such that when a cross section of the silver-tellurium-coated glass powder is observed after a thermal treatment at 350° C., a silver-rich phase is present inside the silver-tellurium-coated glass powder.

A conductive paste of the present invention contains the silver-tellurium-coated glass powder of the present invention.

A method of the present invention for producing a silver-tellurium-coated glass powder includes adding to a silver complex solution, a tellurium-based glass powder containing tellurium in an amount of 20% by mass or more, and then adding a reducing agent to form on a surface of the tellurium-based glass powder, a coating layer containing silver and tellurium as a main component.

Preferably, the method of the present invention for producing a silver-tellurium-coated glass powder includes filtrating, washing, drying, and disintegrating after deposition of silver on the surface of the tellurium-based glass powder.

Also, a method of the present invention for producing a conductive paste includes: adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and mixing the silver-tellurium-coated glass powder with at least a conductive powder, a resin, and an organic solvent. Further preferably, a method of the present invention for producing an electrode for a solar cell includes printing the conductive paste obtained and firing the conductive paste.

Advantageous Effects of Invention

The present invention can provide: a silver-tellurium-coated glass powder capable of improving power generation efficiency of a solar cell when used for an electrode of a solar cell; a method for producing the silver-tellurium-coated glass powder; a conductive paste containing the silver-tellurium-coated glass powder; and a method for producing the conductive paste.

DESCRIPTION OF EMBODIMENTS (Silver-Tellurium-Coated Glass Powder)

A silver-tellurium-coated glass powder of the present invention contains a tellurium-based glass powder containing tellurium in an amount of 20% by mass or more, and a coating layer on a surface of the tellurium-based glass powder, the coating layer containing silver and tellurium as a main component.
<Tellurium-Based Glass Powder>

The tellurium-based glass powder is a glass powder containing tellurium in an amount of 20% by mass or more. The glass powder is also referred to as a glass frit. The above amount of tellurium is defined as an amount thereof contained in the glass when it is subjected to composition analysis by X-ray fluorescence.

The amount of tellurium contained in the tellurium-based glass powder is not particularly limited and may be appropriately selected depending on the intended purpose so long as it is 20% by mass or more. For the purpose of increasing the power generation efficiency of a solar cell (reducing the ohmic resistance of an electrode due to fire-through properties), the amount of tellurium is preferably 30% by mass or more, more preferably 40% by mass or more but 90% by mass or less.

As the component that is other than tellurium and contained in the tellurium-based glass powder, one or more kinds selected from bismuth (Bi), zinc (Zn), lithium (Li), sodium (Na), potassium (K), boron (B), silicon (Si), aluminum (Al), tungsten (W), molybdenum (Mo), manganese (Mn), iron (Fe), vanadium (V), phosphorus (P), lead (Pb), antimony (Sb), magnesium (Mg), calcium (Ca), strontium (Sr), barium (Ba), titanium (Ti), zirconium (Zr), and lanthanum (La) are preferably contained, and one or more kinds selected from zinc, lead, bismuth, silicon, lithium, and aluminum are more preferably contained.

The tellurium in the tellurium-based glass powder may be in the form of any of an oxide, a metal, and an alloy. The oxide of the tellurium may be, for example, tellurium dioxide ($TeO_2$).

The form of an oxide of the component other than tellurium may be, for example, one or more kinds selected from zinc oxide (ZnO), bismuth oxide ($Si_2O_3$), lead oxide (PbO), silicon oxide ($SiO_2$), lithium oxide ($Li_2O_3$), and aluminum oxide ($Al_2O_3$).

The tellurium-based glass powder to be used may be appropriately produced one or a commercially available one.

A volume average particle diameter of the tellurium-based glass powder is preferably 0.1 μm or more but 100 μm or less, more preferably 1 μm or more but 60 μm or less, since it will greatly influence a volume average particle diameter of the silver-tellurium-coated glass powder obtained.

The volume average particle diameter can be measured with, for example, a particle size distribution analyzer of a laser diffraction type.
<Coating Layer Containing Silver and Tellurium as a Main Component>

In the present invention, the coating with silver, and tellurium as a main component means that a substance containing silver and tellurium as a main component is present on the surface of the tellurium-based glass powder. The coating layer containing silver and tellurium as a main component means a substance containing silver and tellurium as a main component that is present on the surface of the tellurium-based glass powder.

The coating may be entirely or partially coating the surface of the tellurium-based glass powder. In the case of partial coating, its coating rate is preferably 40% or more, further preferably 60% or more, in terms of area. The coating rate can be measured by subjecting the silver-tellurium-coated glass powder to, for example, an electron probe micro analyzer (EPMA) or Auger map analysis.

The coating layer may be in various forms. In the case of partial coating, for example, particles containing silver and tellurium as a main component may be sparsely located on the surface of the tellurium-based glass powder.

Amounts of silver (Ag) and tellurium (Te) in the coating layer can be measured using an Auger spectral analyzer through analysis in the depth direction from the surface to the center of the tellurium-based glass powder.

Containing silver and tellurium as a main component means that the total of silver and tellurium is a main component in the coating layer (50% by mass or more but 100% by mass or less). Note that, each of Ag and Te in the coating layer is contained in an amount of at least 10% by mass or more. When Te is contained in the coating layer, the melting point decreases as compared with coating with Ag only, which is assumed to make it easier for silver to diffuse during heating.

When the thickness of the coating layer containing silver and tellurium as a main component is 10 nm or less, the amount of silver and tellurium coexisting is small, and the conversion efficiency (power generation efficiency) of the solar battery cell does not increase. Thus, the thickness is preferably 10 nm or more but 400 nm or less, more preferably 20 nm or more but 300 nm or less. When the thickness is more than 200 nm, the amount of silver is too large, which is not preferable from the economical viewpoint. Thus, the thickness is further preferably 200 nm or less.

The thickness of the coating layer can be measured as the depth of the layer where silver and tellurium are a main component, when analysis in the depth direction from the surface to the center of the silver-tellurium-coated glass powder is performed using an Auger spectral analyzer. The boundary between the coating layer and the deep portion made of the tellurium-based glass powder (i.e., the starting material) can be defined as, for example, a position at which Intensity of the detected Ag and Intensity of the detected oxygen are reversed.

Also, the value of the thickness (depth) of the coating layer can be obtained by converting the time of Ar sputtering to the thickness (depth) based on the etching rate for $SiO_2$.

Now, a calculation method for the amounts of Ag and Te in the coating layer will be described.

The amounts of silver (Ag) and tellurium (Te) in the coating layer can be measured from data of a region corresponding to the coating layer in analysis in the depth direction from the surface to the center of the silver-tellurium-coated glass powder using an Auger spectral analyzer (in data output, the vertical axis is a compositional ratio (Relat. Con. % (unit: at %))). By automated calculation by the Auger spectral analyzer, the vertical axis is converted to and output as the compositional ratio (at %) from the intensity (Int.) of each element. An average of the values of each element in the region corresponding to the coating layer is calculated and converted to % by mass using the atomic mass, to thereby calculate % by mass of silver (Ag) and tellurium (Te) in the coating layer.

The coating layer containing silver and tellurium as a main component may be any of a solid solution containing silver and tellurium as a main component, an intermetallic compound containing silver and tellurium as a main component, an amorphous containing silver and tellurium as a main component, and a mixture of silver and a tellurium compound. Also, since it is assumed that at least part of the surface of the tellurium-based glass is dissolved in the formation of the coating layer, it is assumed that the component that is other than tellurium and contained in the tellurium-based glass powder is contained in the coating layer (as impurities) as a component dissolved together with tellurium or a component partially remaining without being dissolved (oxide).

The oxygen content of the coating layer containing silver and tellurium as a main component is preferably less than the average of the oxygen content of the tellurium-based glass powder to be coated with the coating layer. The tellurium-based glass is mainly an oxide. However, preferably, the coating layer containing silver and tellurium as a main component is mainly composed of any of an alloy, intermetallic compound, and amorphous that are formed under a reducing agent in the presence of silver ions and tellurium ions, and thus the coating layer contains less oxygen than the tellurium-based glass powder.

The oxygen content can be measured by, for example, analysis in the depth direction using an Auger spectral analyzer. The intensity of oxygen in the coating layer containing silver and tellurium as a main component only needs to present a tendency that it is less than the intensity of oxygen at the center of the powder.

When at least part of the surface of the tellurium-based glass powder is provided with the coating layer containing silver and tellurium as a main component, the resultant has good compatibility with a solvent and other silver powder in pasting. For example, use of the silver-tellurium-coated glass powder of the present invention in pasting makes it possible to reduce the viscosity. As the finger electrode of a solar cell gets thinner, a glass powder is assumed to get finer. In general, however, the glass powder tends to be thicker as it gets finer. Thus, it is necessary to additionally add a solvent for adjustment to such a viscosity that is printable, and it is assumed that the properties and shape of the electrode will be adversely influenced as a result. In the silver-tellurium-coated glass powder of the present invention, the influence of thickening due to getting finer can be suppressed at a low level. Thus, the amount of a solvent to be additionally added can be reduced. As a result, the amount of silver contained in the conductive paste can be prevented from reducing, and adverse influences to an electrode such as resistance of a line can be reduced.

It is also expected that good influences will be given to diffusion of tellurium and silver when forming a conductive film by firing. For example, conventionally, firing of a silver powder is performed at 800° C. or higher in a firing-type conductive paste for a solar cell containing a tellurium-based glass powder as a glass frit. A conceivable process thereof is as follows. Specifically, the binder decomposes at 200° C. or higher but 500° C. or lower before the firing of the silver powder starts at 800° C. or higher. The glass frit dissolves at 350° C. or higher but 550° C. or lower depending on the kind of the glass frit. A reaction takes place between the glass frit dissolved at 700° C. or higher and the SiN layer of the solar cell surface to cause fire through. At 800° C. or higher, Pb or Te in the glass frit forms an alloy with Ag. Ag is diffused in the glass to ensure conduction, forming an ohmic contact with the N-type layer under the SiN layer of the solar cell surface. Here, when the surface of the glass frit (tellurium-based glass powder) is provided in advance with the coating layer containing silver and tellurium as a main component, conceivably, it is easy to form an alloy and ensure conduction at a lower temperature than in conventional cases, which contributes to increase in the power generation efficiency of a solar cell.

As to the particle size distribution of the silver-tellurium-coated glass powder, a cumulative 10% point of particle diameter ($D_{10}$) is preferably 0.1 gm or more but 10 μm or less, more preferably 0.3 μm or more but 5 μm or less, particularly preferably 0.5 μm or more but 2 μm or less. Also, a cumulative 50% point of particle diameter ($D_{50}$) is preferably 0.1 μm or more but 20 μm or less, more preferably 0.3 μm or more but 10 μm or less, particularly preferably 1 μm or more but 5 μm or less. Further, a cumulative 90% point of particle diameter ($D_{90}$) is preferably 1 μm or more but 60 μm or less, more preferably 1.5 μm or more but 30 μm or less, particularly preferably 1.5 μm or more but 20 μm or less.

When the cumulative 10% point of particle diameter ($D_{10}$) is less than 0.1 μm, the cumulative 50% point of particle diameter ($D_{50}$) is less than 0.1 μm, and the cumulative 90% point of particle diameter ($D_{90}$) is less than 1 μm, the silver-tellurium-coated glass powder may be insufficient in conductivity. When the cumulative 10% point of particle diameter ($D_{10}$) is more than 10 µm, the cumulative 50% point of particle diameter ($D_{50}$) is more than 20 µm, and the cumulative 90% point of particle diameter (D90) is more than 60 µm, it may be difficult to form fine wirings.

The particle size distribution of the silver-tellurium-coated glass powder with the coating layer containing silver and tellurium as a main component can be measured with, for example, a laser diffraction particle size distribution analyzer (for example, Microtrac manufactured by NIK-KISO CO., LTD.).

The volume average particle diameter of the silver-tellurium-coated glass powder is not particularly limited and may be appropriately selected depending on the intended purpose. Considering applications in conductivity in lines getting thinner, it is preferably 10 µm or less, more preferably 5 µm or less. When the volume average particle diameter is more than 10 µm, it may be difficult to use for applications in conductivity in lines getting thinner.

The volume average particle diameter can be measured with, for example, a laser diffraction particle size distribution analyzer (for example, Microtrac manufactured by NIKKISO CO., LTD.).

A BET specific surface area of the silver-tellurium-coated glass powder is not particularly limited and may be appropriately selected depending on the intended purpose. It is preferably 0.1 m²/g or more but 70 m²/g or less, more preferably 0.5 m²/g or more but 10 m²/g or less. The BET specific surface area can be measured with, for example, a commercially available BET specific surface area measuring device.

The surface of the silver-tellurium-coated glass powder may be coated with a surface treatment agent made of an organic material such as a fatty acid.

The content of silver in the silver-tellurium-coated glass powder is not particularly limited and may be appropriately selected depending on the intended purpose. It is preferably 5% by mass or more but 90% by mass or less, more preferably 5% by mass or more but 70% by mass or less, further preferably 5% by mass or more but 50% by mass or less, relative to the total amount of the silver-tellurium-coated glass powder.

As to lightness of the silver-tellurium-coated glass powder, the value of L* measured in accordance with JIS Z8722 is preferably 60 or less. When at least part of the surface of the tellurium-based glass powder is provided with the coating layer containing silver and tellurium as a main component, the color of the surface greatly changes from that of the tellurium-based glass powder, and the lightness L* value decreases.

<Embodiment 1: $TeO_2.Bi_2O_3$ based>

Figure 1:
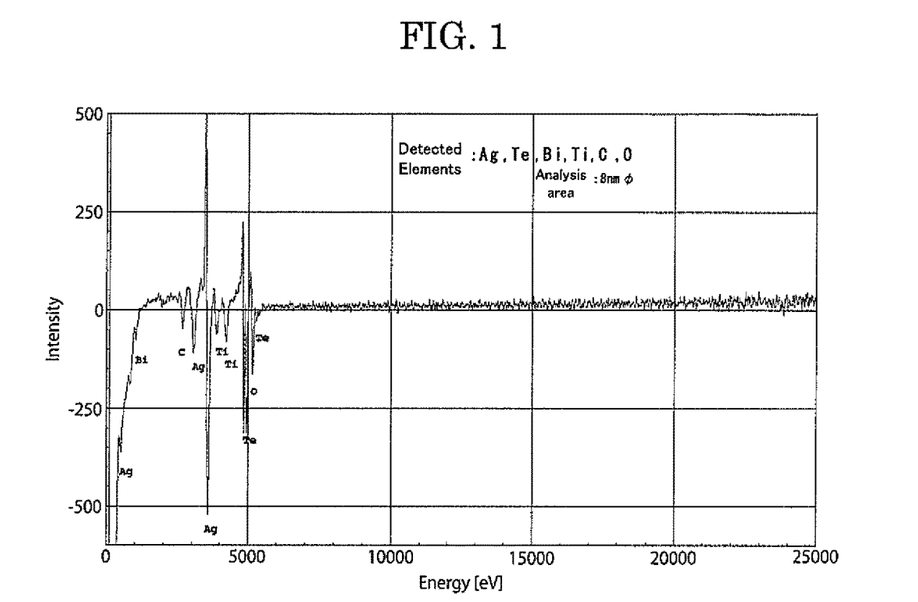
FIG. 1 is a graph presenting results of qualitative analysis by a SEM image and Auger spectral analysis of the silver-tellurium-coated glass powder of Example 1.

By subjecting the silver-tellurium-coated glass powder to qualitative analysis of the surface of the tellurium-based glass powder and analysis in the depth direction from the surface to the center of the tellurium-based glass powder using an Auger spectral analyzer (JAMP-9500F manufactured by JEOL, Ltd.), it is possible to confirm the presence of a layer containing silver and tellurium. As examples, FIG. 1 presents the results of qualitative analysis by Auger spectral analysis of the silver-tellurium-coated glass powder of Example 1 described below, FIG. 2 presents the results of analysis in the depth direction of the elements detected from the results of qualitative analysis, and FIG. 3 presents the analysis results in which the vertical axis of FIG. 2 is converted to a compositional ratio.

Figure 2:
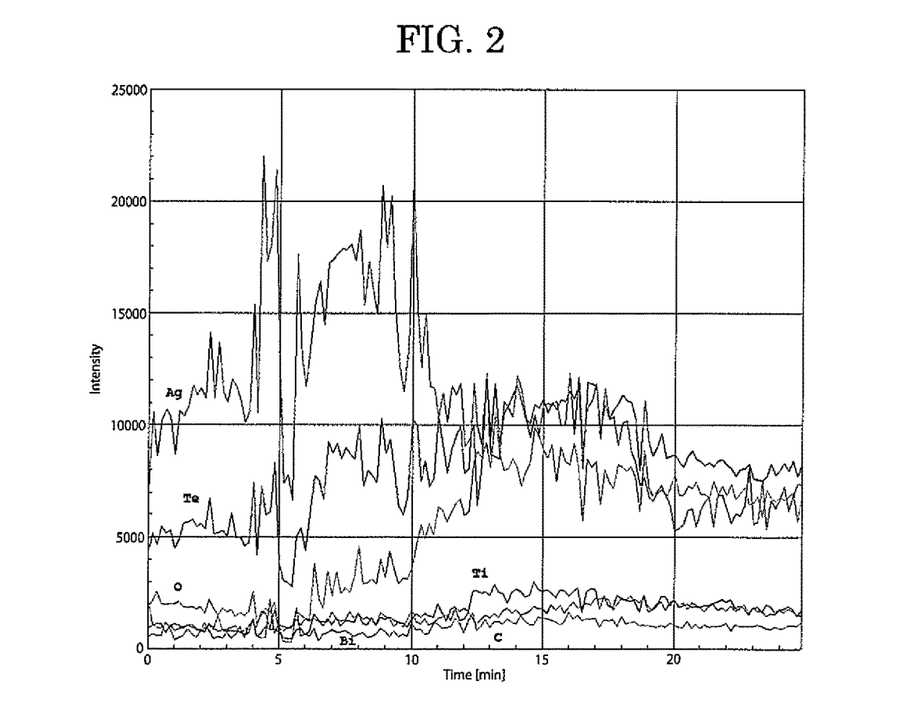
FIG. 2 is a graph presenting results of analysis in the depth direction by a SEM image and Auger spectral analysis of the silver-tellurium-coated glass powder of Example 1.
Figure 3:
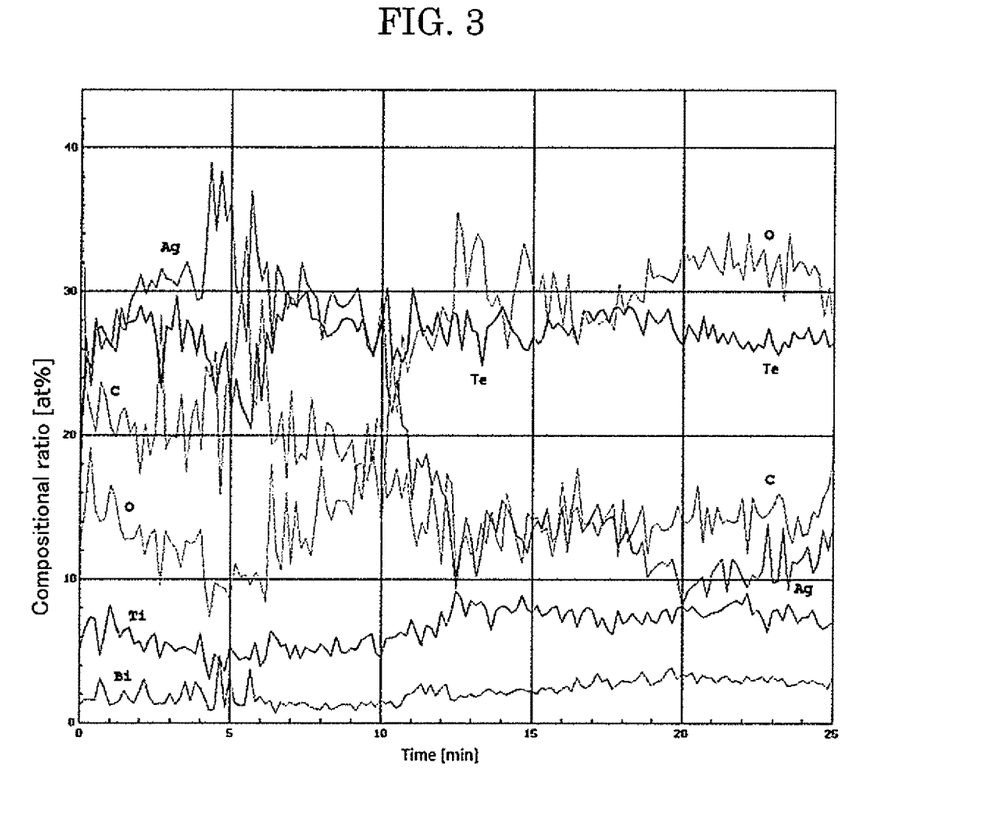
FIG. 3 is a graph presenting results of analysis in the depth direction by a SEM image and Auger spectral analysis of the silver-tellurium-coated glass powder of Example 1 in FIG. 2, with the vertical axis being a compositional ratio.
Figure 4:
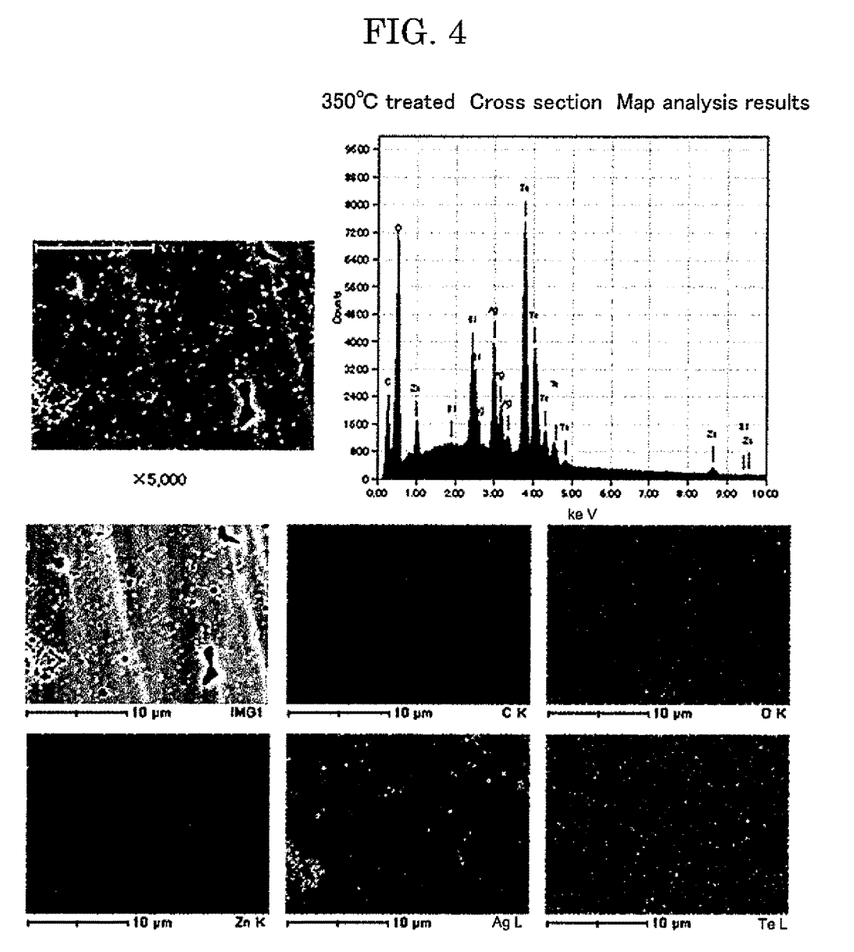
FIG. 4 presents SEM images and EDS map analysis results of the cross section of the silver-tellurium-coated glass powder after the silver-tellurium-coated glass powder of Example 1 is thermally treated at 350° C.

FIG. 2 presents the analysis results in the depth direction from the surface to about 308 nm.

The analysis conditions are that the Ar sputtering etching rate is 12.3 nm/min ($SiO_2$) and the analysis area is 8 nm φ.

The qualitative analysis results indicate that the uppermost surface contains Ag, Te, Bi, Ti, O, and C, but Zn and other elements contained in the components of the tellurium-based glass were not detected.

The analysis in the depth direction indicates that the peaks of the detected elements are different between the region where Ag and Te coexist (the region at the surface side; i.e., the range from the surface to a depth of about 140 nm in FIG. 2) and the deep region (the region of the core made of the tellurium-based glass powder; i.e., the range from the surface to a depth more than about 140 nm in FIG. 2). For the value of the depth, the etching rate used was a value for the defined $SiO_2$ (12.3 nm/min). Ag is more at the surface side and the oxygen content at the surface side is equal to or less than half the average of the oxygen content in the deep region. This indicates that the coating layer present on the surface may contain an alloy (intermetallic compound) containing Ag and Te.

In the analysis in the depth direction of Example 1 (FIG. 3, the vertical axis of which is a compositional ratio), the compositional ratio of each element calculated from the averages of the compositional ratios (at %) of the measured elements in the range of 0 nm to 140 nm and the total of the averages thereof is that Ag is 29.27 at %, Te is 27.23 at %, O is 14.91 at %, Ti is 5.57 at %, Bi is 1.7 at %, and C is 21.33 at %. When converted to % by mass, Te was calculated as 44.84% by mass and the total of Ag and Te was calculated as 85.58% by mass.

<Embodiment 2: $TeO_2.Pb_2O_3$-Based>

The silver-tellurium-coated glass powder of Example 5 described below was analyzed in the same manner as described above to obtain the results of qualitative analysis by Auger spectral analysis and the results of analysis in the depth direction. The results of qualitative analysis indicate that the uppermost surface contains Ag, Te, Si, O, and C, but Pb and other elements contained in the components of the tellurium-based glass were not detected. The analysis conditions are that the Ar sputtering etching rate is 10.6 nm/min ($SiO_2$) and the analysis area is 8 nm φ. When confirming the position at which silver and oxygen are reversed, the range of the coating layer was from the uppermost surface to a depth of 200 nm. The compositional ratio of each element calculated from the averages of the compositional ratios (at %) of the measured elements in the range of 0 nm to 200 nm and the total of the averages thereof is that Ag is 33.95 at %, Te is 16.1 at %, O is 18.59 at %, Si is 9.27 at %, and C is 22.1 at %. When converted to % by mass, Te was calculated as 31.4% by mass and the total of Ag and Te was calculated as 87.4% by mass.

—Evaluation 1 of the Silver-Tellurium-Coated Glass Powder by Thermal Treatment—

In the above example, when the silver-tellurium-coated glass powder containing the coating layer containing silver and tellurium as a main component is thermally treated at 350° C., Ag in the coating layer is diffused inside the tellurium-based glass powder. When a cross section of the silver-tellurium-coated glass powder is observed, a silver-rich phase is sparsely present inside the silver-tellurium-coated glass powder. The silver-rich phase is formed of one or more kinds selected from silver, a solid solution containing silver, an intermetallic compound containing silver, and an amorphous containing silver. This is a phenomenon that occurs because of the presence of the coating layer but does not occurs in the absence of the coating layer. Thus, the coating layer containing silver and tellurium as a main component is assumed to make it easy to form an alloy and ensure conduction at a lower temperature than in conventional cases.

FIG. 3 presents a cross-sectional SEM image and EDS map analysis results of the silver-tellurium-coated glass powder after the silver-tellurium-coated glass powder containing the coating layer containing silver and tellurium as a main component described in Example 1 below is thermally treated at 350° C. The cross-sectional SEM image and the EDS thereof were measured using a FE-SEM device (JSM-6700F manufactured by JEOL, Ltd.).

As is observed from FIG. 3, silver is sparsely located inside the silver-tellurium-coated glass powder. Before the thermal treatment, no silver is observed inside the silver-tellurium-coated glass powder (the region of the tellurium-based glass serving as the starting material). Thus, as a result of the thermal treatment at 350° C., silver in the coating layer may be diffused in the entirety of the silver-tellurium-coated glass powder, and the granular or linear silver-rich phase may be deposited at, for example, the grain boundary inside the tellurium-based glass powder. Also, no difference in distribution is observed between the surface and the inside of the powder in the EDS map analysis results. Conceivably, almost all the silver contained in the silver-tellurium-coated glass powder is diffused in the entirety of the silver-tellurium-coated glass powder, and the silver-rich phase is sparsely located in the entirety of the silver-tellurium-coated glass powder.

Note that, when a silver powder and a tellurium-based glass powder are mixed together and thermally treated at 350° C., the silver is not diffused inside the tellurium-based glass powder. As a result, when a cross section of the tellurium-based glass powder is observed, no silver is present inside the tellurium-based glass powder. When a tellurium-based glass powder and a silver powder (AG-4-8F manufactured by DOWA HIGHTECH CO., LTD.) in an amount of 11% by mass relative to the tellurium-based glass powder are mixed together and thermally treated at 350° C., no silver is observed inside the tellurium-based glass powder, in general. Even if silver is observed inside the tellurium-based glass powder, its amount is very small as compared with the amount of the silver powder mixed.

From the above observation results, a possible reason why the power generation efficiency of a solar cell can be increased when the silver-tellurium-coated glass powder containing the coating layer containing silver and tellurium as a main component is used for a conductive paste is that silver is diffused inside the tellurium-based glass powder in a lower temperature range than the firing temperature of the conductive paste to make it easier to form conduction paths even inside the tellurium-based glass powder. Therefore, conceivably, conductivity of a conductive film after firing increases to result in increase in the power generation efficiency of a solar cell.

—Evaluation 2 of the Silver-Tellurium-Coated Glass Powder by Thermal Treatment—
<Discussion of Behaviors in the Conductive Paste by IR Furnace Test>

In the case where the silver-tellurium-coated glass powder of Example 5 was directly coated on an anti-reflection film (SiN) of a silicon substrate (100 Ω/sq.) for a solar cell and in the case where a mixture containing a silver powder (AG-3-96F manufactured by DOWA HIGHTECH CO., LTD.) and the tellurium-based glass powder (Comparative Example 5) mixed in a mass ratio of 10:90 was directly coated thereon, a high-speed firing IR furnace (manufactured by NGK INSULATORS, LTD.) was used in high-speed heating for in-out 21 sec with the temperature upon the peak (firing temperature) being set to 450° C. or 500° C., and the resultant state after the high-speed firing was observed using a microscope (KEYENCE VHX-5000 manufactured by KEYENCE CORPORATION).

Figure 5:
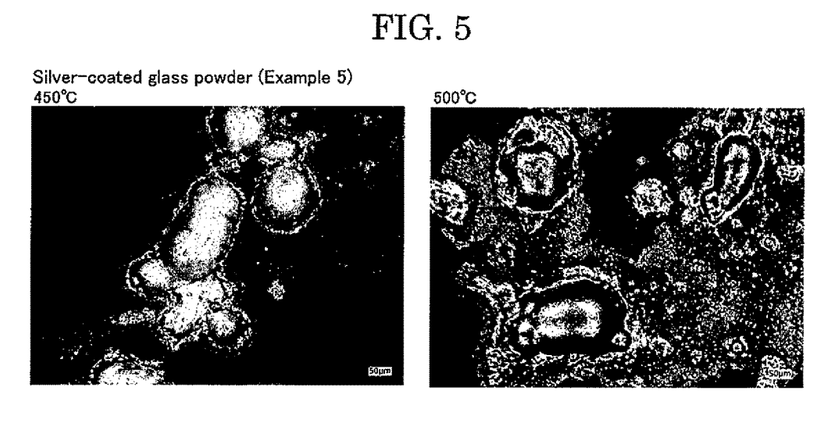
FIG. 5 presents microscope images obtained after the silver-tellurium-coated glass powder of Example 5 is thermally treated at 450° C. or 500° C. on an anti-reflection film (SiN) of a silicon substrate for a solar cell.
Figure 6:
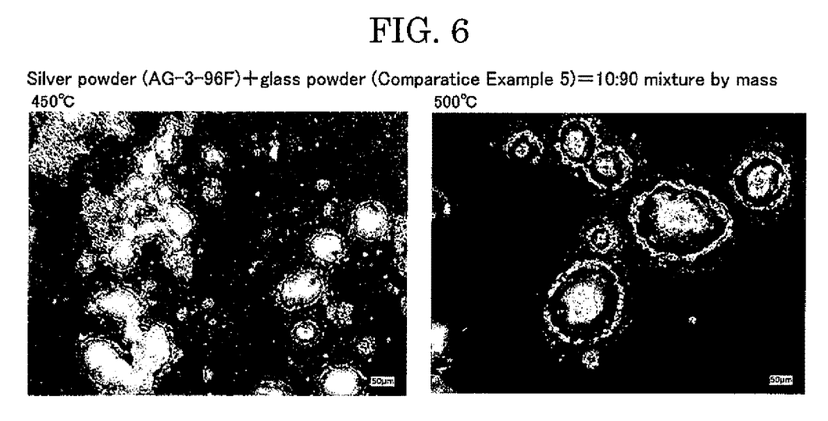
FIG. 6 presents microscope images obtained after a 10:90 mixture of the silver powder and the tellurium-based glass powder of Comparative Example 5 is thermally treated at 450° C. or 500° C. on an anti-reflection film (SiN) of a silicon substrate for a solar cell.

As the results thereof, FIG. 5 presents microscope images obtained after the silver-tellurium-coated glass powder of Example 5 was thermally treated at 450° C. or 500° C. on the anti-reflection film (SiN) of a silicon substrate for a solar cell. FIG. 6 presents microscope images obtained after the 10:90 mixture of the silver powder and the tellurium-based glass powder of Comparative Example 5 was thermally treated at 450° C. or 500° C. on the anti-reflection film (SiN) of a silicon substrate for a solar cell.

In the above observation results, the silver of the silver-tellurium-coated glass powder of Example 5 is wet-spread on the anti-reflection film (SiN) of a silicon substrate for a solar cell in the case of being heated to 500° C. (FIG. 5, the right-hand panel) more than in the case of being heated to 450° C. (FIG. 5, the left-hand panel). On the other hand, the silver powder of the tellurium-based glass powder without the coating layer (Comparative Example 5) is observed to gather around the tellurium-based glass powder in the case of being heated to 500° C. (FIG. 6, the right-hand panel) more than in the case of being heated to 450° C. (FIG. 6, the left-hand panel), but the silver powder thereof is not wet-spread as in the silver-tellurium-coated glass powder. Therefore, conceivably, reaction between the silver-tellurium-coated glass powder of Example 5 and the anti-reflection film easily proceeds at a low temperature (500° C.).

Such easiness of the silver-tellurium-coated glass powder itself to wet-spread on the silicon substrate for a solar cell at a low temperature is assumed to contribute to increase in conversion efficiency when the silver-tellurium-coated glass powder is used for a conductive paste.

(Method for Producing Silver-Tellurium-Coated Glass Powder)

A method of the present invention for producing a silver-tellurium-coated glass powder includes adding to a silver complex solution, a tellurium-based glass powder containing tellurium in an amount of 20% by mass or more, and then adding a reducing agent and if necessary other components to form on a surface of the tellurium-based glass powder through reduction reaction of silver, a coating layer containing silver and tellurium as a main component.

Also, in order to make an unreduced silver absent in the silver complex solution, the method may include an aging time for depositing at least one of silver and a silver tellurium compound on the surface of the tellurium-based glass powder until completion of the reduction reaction. The method may further include steps of filtrating, washing, drying, and disintegrating after coating, if necessary.

The method for producing a silver-tellurium-coated glass powder includes a starting material liquid preparation step of preparing a starting material; a complexing step of complexing silver in an aqueous solution containing a silver compound obtained in the starting material liquid preparation step; a coating step of adding a tellurium-based glass powder to a silver complex solution obtained in the complexing step and adding a reducing agent and if necessary other components to make reduction reaction take place, to thereby coat a surface of the tellurium-based glass powder with a coating layer containing silver and tellurium as a main component; and if necessary includes, after the coating step, a surface treatment step of treating the silver-telluriumcoated glass powder with a surface treatment agent, a filtrating step, a washing step, a drying step, a disintegrating step, and a classifying step.

<Starting Material Liquid Preparation Step>

The starting material liquid preparation step is a step of preparing a starting material.

A silver compound-containing aqueous solution can be obtained by adding a silver compound to a reaction vessel where pure water is being stirred, followed by stirring.

Examples of the silver compound include silver nitrate, silver carbonate, and silver acetate. These may be used alone or in combination. Among them, use of silver nitrate is preferable in terms of, for example, cost.

<Complexing Step>

The complexing step is a step of complexing silver in the silver compound-containing aqueous solution obtained in the starting material liquid preparation step.

In the complexing step, a silver complex solution can be obtained by complexing silver in the silver compound-containing aqueous solution obtained in the starting material liquid preparation step.

A method for the complexing is, for example, use of a silver complexing agent.

The silver complexing agent is not particularly limited and may be appropriately selected depending on the intended purpose. Examples thereof include aqueous ammonia, ammonium salts, and chelating compounds. These may be used alone or in combination. Among them, aqueous ammonia is preferable.

Here, it is preferably to adjust the pH of the silver compound-containing aqueous solution after the complexing step to be in the range of 9 to 13.

<Coating Step>

The coating step is a step of coating the surface of a tellurium-based glass powder with a coating layer containing silver and tellurium as a main component by adding the tellurium-based glass powder to the silver complex solution obtained in the complexing step and adding a reducing agent and if necessary other components to make reduction reaction take place.

The reducing agent is not particularly limited and may be appropriately selected depending on the intended purpose. Examples thereof include ascorbic acid, sulfites, alkanolamines, aqueous hydrogen peroxide, formic acid, ammonium formate, sodium formate, glyoxal, tartaric acid, sodium hypophosphite, sodium borohydride, hydroquinone, hydrazine, hydrazine derivatives, pyrogallol, glucose, gallic acid, formalin, anhydrous sodium sulfite, and Rongalite. These may be used alone or in combination. Among them, ascorbic acid, alkanolamines, sodium borohydride, hydroquinone, hydrazine, and formalin are preferable. Formalin, hydrazine, and sodium borohydride are more preferable because they are inexpensive.

The amount of the reducing agent to be added is not particularly limited and may be appropriately selected depending on the intended purpose.

The coating step may include an aging time. The "aging" means to continue, until unreacted silver in the silver complex solution becomes absent, the reaction for forming the coating layer containing silver and tellurium as a main component on the surface of the tellurium-based glass powder while the tellurium-based glass powder and the silver complex solution are being mixed and stirred.

The aging time is not particularly limited but is preferably one minute or more.

The presence or absence of unreacted silver in the silver complex solution can be confirmed based on whether a filtrate obtained through filtration of the reaction liquid becomes clouded in white after addition of a sodium chloride solution to the filtrate. Specifically, when silver (Ag) ions are not left in the filtrate, poorly soluble silver chloride (AgCl; white) is not formed through reaction between chloride derived from sodium chloride (NaCl) and silver (Ag) ions. This makes it possible to determine completion of the reaction.

The liquid temperature in the coating step and during the aging time is not particularly limited. It is preferably 10° C. or higher but 50° C. or lower.

Examples of the other components include a reducing aid and a surface treatment agent. As described below, a surface treatment agent in the surface treatment step may be added at the timing before the reduction reaction or during the reduction.

The reducing aid is not particularly limited and may be appropriately selected depending on the intended purpose. Use of sodium borohydride or colloidal particles is preferable. As a result of adding a liquid where the colloidal particles are dispersed, the particles of nano size become nuclei to increase sites where silver is to be deposited. This makes it possible to make unreduced silver absent. In terms of conductivity, the colloidal particles to be used are preferably metal colloidal particles of nano size, particularly preferably a silver colloidal liquid.

The amount of the reducing aid to be added is not particularly limited and can be appropriately adjusted so as not to leave unreacted silver.

<Surface Treatment Step>

Although the surface treatment step is not essential, the silver-tellurium-coated glass powder may be treated with a surface treatment agent. This makes it possible to suppress aggregation of powder.

<Filtrating Step, Washing Step, Drying Step, Disintegrating Step, and Classifying Step>

When the silver-coated glass powder-containing slurry obtained in the dispersing step is filtrated by aspiration and washed with water, a cake in the form of mass with almost no fluidity is obtained. For the purposes of, for example, accelerating dry of the cake and preventing aggregation during drying, water in the cake may be substituted with, for example, lower alcohol or polyol. The cake can be dried with a dryer such as a forced circulation air dryer, a vacuum dryer, or an airflow dryer, followed by disintegrating, to thereby obtain a silver-tellurium-coated glass powder. Instead of the disintegrating, a surface flattening treatment may be performed. In the surface flattening treatment, the silver-tellurium-coated glass powder is charged into an apparatus capable of mechanically fluidizing particles, and the particles are allowed to mechanically crush with each other to flatten irregularities and angular parts on the surface of the silver-tellurium-coated glass powder. Also, a classification treatment may be performed after the disintegrating or the surface flattening treatment. Note that, drying, pulverizing, and classifying can be performed using an integrated apparatus capable of performing drying, pulverizing, and classifying (e.g., DRYMEISTER and MICRON DRYER manufacture by HOSOKAWA MICRON CORPORATION).

(Conductive Paste)

A conductive paste of the present invention contains the silver-tellurium-coated glass powder of the present invention, preferably contains a conductive powder such as a silver powder, a resin, and an organic solvent, and if necessary further contains other components. Note that, it may further contain a glass frit other than the silver-tellurium-coated glass powder.

A method of the present invention for producing a conductive paste includes: adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and mixing the silver-tellurium-coated glass powder with at least a conductive powder, a resin, and an organic solvent; and if necessary further contains other steps.

The above mixing can be performed using, for example, an ultrasonic disperser, a disper, a triple roll mill, a ball mill, a bead mill, a biaxial kneader, or a planetary centrifugal stirrer.

A method for producing an electrode for a solar cell preferably includes printing the obtained conductive paste and firing the conductive paste.

An amount of the silver-tellurium-coated glass powder in the conductive paste is not particularly limited and may be appropriately selected depending on the intended purpose. The amount thereof is preferably adjusted so that the viscosity of the conductive paste becomes 10 Pa·s or more but 1,000 Pa·s or less at 25° C. When the viscosity of the conductive paste is less than 10 Pa·s, "bleeding" may occur in the low viscosity region. When the viscosity of the conductive paste is more than 1,000 Pa·s, printing failures such as "blurring" may occur in the high viscosity region. Also, the viscosity of the conductive paste can be adjusted in other manners than adjusting the amount of silver-tellurium-coated glass powder, such as adding a viscosity modifier or selecting the kind of a solvent.

The conductive paste containing the silver-tellurium-coated glass powder of the present invention can be more suitably used as a conductive paste for forming electrodes of firing-type solar cells and electrodes and circuits of various electronic components, as compared with conventional conductive pastes. The silver-tellurium-coated glass powder of the present invention can be particularly suitably used as a firing-type conductive paste.

EXAMPLES

The present invention will next be described by way of Examples. The present invention, however, should not be construed as being limited to these Examples.

Example 1

—Production of Silver-Tellurium-Coated Glass Powder—

10 g of a tellurium-based glass powder (containing Te: 69.8% by mass, Bi: 23.7% by mass, and Zn: 6.5% by mass (as analysis results by X-ray fluorescence), softening point: 344° C., and density: 5.3 g/cm$^3$) was provided.

3.47 g of a silver nitrate aqueous solution containing silver at 32% by mass was mixed and diluted in a 1 L-beaker where 787 g of pure water was being stirred, to thereby prepare a silver nitrate aqueous solution containing 1.11 g of silver. Subsequently, 2.5 g of 28% by mass aqueous ammonia was added as a complexing agent to this beaker to obtain a silver ammine complex salt aqueous solution (pH: 11). The liquid temperature of this silver ammine complex salt aqueous solution was adjusted to 30° C. and then 10 g of the tellurium-based glass powder was added thereto. Immediately after that, a previously prepared mixture containing 0.3 g of hydrazine serving as a reducing agent, 10.3 g of silver colloid [the solvent was pure water, the TEM particle diameter of the contained nanoparticle silver was 5 nm to 40 nm, and the amount of the nanoparticle silver was 0.01 g (0.001 times the amount of silver in the aqueous solution)], and 20 g of pure water was added thereto. With an aging time (waiting time for preventing unreduced silver from remaining in the liquid) being set to 5 minutes, a coating layer containing silver and tellurium as a main component was formed on the surface of the tellurium-based glass powder.

5 minutes after the addition of the reducing agent, a silver-coated glass powder-containing slurry was filtrated through aspiration, and was washed with pure water until the potential of the liquid after the washing became 0.5 mS/m or lower, whereby a cake was obtained. The obtained cake was dried for 10 hours with a vacuum dryer of 75° C., to thereby obtain a silver-tellurium-coated glass powder of Example 1 containing a coating layer containing silver and tellurium as a main component.

The composition analysis of the obtained silver-tellurium-coated glass powder by X-ray fluorescence was performed with an energy dispersive X-ray fluorescence analyzer (JSX-3201 manufactured by JEOL, Ltd.). The results are presented in Table 1-1.

The pH of the filtrate at the time of the aspiration filtration was 9.6. As a result of ICP emission analysis (SPS5100 manufactured by SIT Co.), Te was found to be 58.0 ppm. The results are presented in Table 2.

Next, the obtained silver-tellurium-coated glass powder was measured for various properties in the following manners. The results are presented in Table 1-2.

[Measurement of the Thickness of the Coating Layer]

The thickness of the coating layer was measured as the depth of a layer where silver and tellurium were a main component, when analysis in the depth direction from the surface to the center of the silver-tellurium-coated glass powder was performed using an Auger spectral analyzer (JAMP-9500F manufactured by JEOL, Ltd.). The boundary between the coating layer and the deep portion made of the tellurium-based glass powder (i.e., the starting material) can be defined as, for example, a position at which the peak of Ag is lower than the peak of Te or oxygen. Also, the value of the thickness (depth) of the coating layer was obtained by converting the time of Ar sputtering to the thickness (depth) based on the etching rate for SiO2.

[Particle Size Distribution]

The particle size distribution of the silver-tellurium-coated glass powder was measured with a laser diffraction particle size distribution analyzer (Microtrac particle size distribution analyzer manufactured by NIKKISO CO., LTD. (MT3300EXII manufactured by Microtrac Co.)) to obtain a cumulative 10% point of particle diameter ($D_{10}$), a cumulative 50% point of particle diameter (D50), and a cumulative 90% point of particle diameter ($D_{90}$).

[Measurement of BET Specific Surface Area]

The BET specific surface area of the silver-tellurium-coated glass powder was measured with a specific surface area measuring device (device name: Macsorb, manufactured by MOUNTECH Co.) by the single point BET method using nitrogen adsorption. Note that, in the measurement of the BET specific surface area, degassing conditions before the measurement were 60° C. and 10 minutes.

Next, the obtained silver-tellurium-coated glass powder was used to produce a conductive paste in the following manner.

<Production of Conductive Paste>

The following components were weighed so as to be 1.6% by mass of the obtained silver-tellurium-coated glass powder (silver content: 15.8% by mass), 88.5% by mass of a silver powder (AG-4-8F manufactured by DOWA HIGHTECH CO., LTD.), 1.2% by mass of a resin (manufactured by Wako Pure Chemical Industries, Ltd., ethyl cellulose), 3.95% by mass of a solvent (manufactured by JMC CO., LTD., TEXANOL), 3.95% by mass of a solvent (manufactured by Wako Pure Chemical Industries, Ltd., butyl carbitol acetate), 0.3% by mass of magnesium stearate (manufactured by Wako Pure Chemical Industries, Ltd.), and 0.5% by mass of oleic acid (manufactured by Wako Pure Chemical Industries, Ltd.). These components were mixed (preliminarily mixed) with a planetary centrifugal stirrer and bubble remover (manufactured by THINKY Corporation, Awatori Rentaro), followed by kneading with a triple roll mill (manufactured by OTTO HERRMANN, INC., EXAKT80S), to thereby obtain a conductive paste.

The viscosity of the obtained conductive paste was measured for a 5-min value at 1 rpm and a 1-min value at 5 rpm using a corn plate of CPE-52 in a viscometer (manufactured by Brookfield Co., HBDV-III ULTRA). The results are presented in Table 3-1.

Next, the obtained conductive paste was used to produce a solar cell in the following manner.

<Production of Solar Cell>

An aluminum paste (manufactured by TOYO ALUMINUM K. K., ALSOLAR 14-7021) was used to form a solid pattern of 154 mm square on a back surface of a silicone substrate (80 Ω/sq.) for a solar cell using a screen printing machine (manufactured by Microtrac Co., MT-320T).

A hot air dryer was used for drying at 200° C. for 10 minutes.

The conductive paste of Example 1 was used to form a finger electrode having a width of 40 μm and three bus bar electrodes on a front surface of the substrate.

A hot air dryer was used for drying at 200° C. for 10 minutes.

A high-speed firing IR furnace (manufactured by NGK INSULATORS, LTD.) was used in high-speed heating for in-out 21 sec with the temperature upon the peak (firing temperature) being set to 810° C. or 830° C. Through the above procedure, a solar cell was produced.

<Evaluation of Solar Cell Characteristics>

The produced solar cell was evaluated for solar cell characteristics using a solar simulator manufactured by WACOM Co. The results are presented in Table 3-2.

The conversion efficiency of the obtained solar cell was found to be 18.10% at a firing temperature of 810° C. and 17.83% at a firing temperature of 830° C.

Example 2

A silver-tellurium-coated glass powder was obtained in the same manner as in Example 1 except that the composition of the tellurium-based glass powder in Example 1 was changed to the following: (containing Te: 69.5% by mass, Bi: 23.8% by mass, and Zn: 6.8% by mass (as analysis results by X-ray fluorescence), softening point: 334° C., and density: 5.2 g/cm$^3$).

Next, the obtained silver-tellurium-coated glass powder was measured for various properties in the same manner as in Example 1. The results are presented in Table 1-1 and Table 1-2.

The pH of the filtrate was 9.6, and as a result of ICP emission analysis (SPS5100 manufactured by SII Co.), Te was found to be 89.7 ppm. The results are presented in Table 2.

The obtained silver-tellurium-coated glass powder was used in the same manner as in Example 1 to produce a conductive paste and a solar cell. The viscosity of the conductive paste and the characteristics of the Solar cell were evaluated. The results are presented in Table 3-1 and Table 3-2.

The conversion efficiency of the obtained solar cell was found to be 18.14% at a firing temperature of 810° C. and 18.14% at a firing temperature of 830° C.

Comparative Example 1

A solar cell was produced in the same manner as in Example 1 except that 1.6% by mass of the tellurium-based glass powder serving as the starting material described in Example 1 containing no coating layer was added instead of the silver-tellurium-coated glass powder in Example 1. Characteristics of the solar cell were evaluated in the same manner as in Example 1. The results are presented in Table 3-2.

The conversion efficiency of the obtained solar cell was found to be 17.83% at a firing temperature of 810° C. and 17.72% at a firing temperature of 830° C.

Comparative Example 2

A solar cell was produced in the same manner as in Example 2 except that 1.6% by mass of the tellurium-based glass powder serving as the starting material described in Example 2 containing no coating layer was added instead of the silver-tellurium-coated glass powder in Example 2. Characteristics of the solar cell were evaluated in the same manner as in Example 2. The results are presented in Table 3-2.

The conversion efficiency of the obtained solar cell was found to be 18.12% at a firing temperature of 810° C. and 18.05% at a firing temperature of 830° C.

Referential Example 1

A solar cell was produced in the same manner as in Example 1 except that a tellurium-free glass powder (containing Ba: 61.8% by mass, Zn: 29.1% by mass, and Bi: 15.0% by mass (as analysis results by X-ray fluorescence), softening point: 526° C., and density: 3.4 g/cm$^3$) was used instead of the tellurium-based glass powder in Example 1. Characteristics of the solar cell were evaluated in the same manner as in Example 1. The results are presented in Table 3-2.

The solar cell of Referential Example 1 did not contain tellurium and thus the conversion efficiency was very low. The conversion efficiency of the solar cell using the glass powder coated with a silver layer was found to be 3.41% at a firing temperature of 830° C.

TABLE 1-1

| | Composition analysis values (% by mass) | | | |
|---|---|---|---|---|
| | Ag amount | Te amount | Bi amount | Zn amount |
| Comp. Ex. 1 | — | 69.8 | 23.7 | 6.5 |
| Ex. 1 | 15.8 | 57.4 | 21.0 | 5.8 |

TABLE 1-1-continued

| | Composition analysis values (% by mass) | | | |
|---|---|---|---|---|
| | Ag amount | Te amount | Bi amount | Zn amount |
| Comp. Ex. 2 | — | 69.5 | 23.8 | 6.8 |
| Ex. 2 | 17.3 | 56.0 | 20.9 | 5.9 |

TABLE 1-2

| | Particle size distribution (μm) | | | BET specific surface area (m²/g) |
|---|---|---|---|---|
| | $D_{10}$ | $D_{50}$ | $D_{90}$ | |
| Comp. Ex. 1 | 0.6 | 1.1 | 2.3 | 3.38 |
| Ex. 1 | 0.5 | 1.1 | 2.2 | 6.91 |
| Comp. Ex. 2 | 0.6 | 1.1 | 2.5 | 4.02 |
| Ex. 2 | 0.5 | 1.0 | 1.9 | 5.73 |

TABLE 2

| | Filtrate data (ppm) | | | | | | |
|---|---|---|---|---|---|---|---|
| | Te | Li | Si | Cu | B | Na | Zr |
| Ex. 1 | 58.0 | 5.3 | — | 2.2 | — | — | — |
| Ex. 2 | 89.7 | 9.3 | 0.3 | — | 0.5 | 0.3 | 0.5 |

TABLE 3-1

| | Properties of conductive paste Viscosity (Pa · s) | |
|---|---|---|
| | 1 rpm | 5 rpm |
| Comp. Ex. 1 | 329 | 102 |
| Ex. 1 | 329 | 109 |
| Comp. Ex. 2 | 329 | 107 |
| Ex. 2 | 329 | 114 |

TABLE 3-2

| | Evaluation results of solar cell characteristics | | | | | |
|---|---|---|---|---|---|---|
| | Firing temp. (° C.) | Short-circuit current (A) | Open-circuit voltage (V) | Fill factor (%) | Conversion efficiency (%) | Series resistance (Ω) |
| Comp. Ex. 1 | 810 | 8.87 | 0.625 | 78.25 | 17.83 | 0.0063 |
| | 830 | 8.90 | 0.622 | 77.86 | 17.72 | 0.0066 |
| Ex. 1 | 810 | 8.90 | 0.627 | 78.90 | 18.10 | 0.0063 |
| | 830 | 8.89 | 0.625 | 78.04 | 17.83 | 0.0064 |
| Comp. Ex. 2 | 810 | 8.87 | 0.628 | 79.06 | 18.12 | 0.0064 |
| | 830 | 8.92 | 0.626 | 78.67 | 18.05 | 0.0064 |
| Ex. 2 | 810 | 8.87 | 0.630 | 79.01 | 18.14 | 0.0064 |
| | 830 | 8.93 | 0.629 | 78.52 | 18.14 | 0.0066 |
| Ref. Ex. 1 | 830 | 5.02 | 0.625 | 26.37 | 3.41 | 0.12 |

It is found that the conductive paste using the silver-tellurium-coated glass powder of the present invention has an effect of increasing the conversion efficiency of the solar cell as compared to the case of using the tellurium-based glass powder having no coating layer containing silver and tellurium as a main component.

Example 3

Next, the silver-tellurium-coated glass powder of Example 1 was used to produce a conductive paste having a different compositional ratio from that in Example 1.

The following components were weighed so as to be 1.6% by mass of the silver-tellurium-coated glass powder of Example 1, 89.5% by mass of a silver powder (AG-4-8F manufactured by DOWA HIGHTECH CO., LTD.), 1.2% by mass of a resin (manufactured by Wako Pure Chemical Industries, Ltd., ethyl cellulose), 3.45% by mass of a solvent (manufactured by JMC CO., LTD., TEXANOL), 3.45% by mass of a solvent (manufactured by Wako Pure Chemical Industries, Ltd., butyl carbitol acetate), 0.3% by mass of magnesium stearate (manufactured by Wako Pure Chemical Industries, Ltd.), and 0.5% by mass of oleic acid (manufactured by Wako Pure Chemical Industries, Ltd.). These components were mixed (preliminarily mixed) with a planetary centrifugal stirrer and bubble remover (manufactured by THINKY Corporation, Awatori Rentaro ARE-310), followed by kneading with a triple roll mill (manufactured by EXAKT Co., M-80S), to thereby obtain a conductive paste relating to Example 3.

The viscosity of the obtained conductive paste was measured for a 5-min value at 1 rpm and a 1-min value at 5 rpm using a corn plate of CPE-52 in a viscometer (manufactured by Brookfield Co., HBDV-III ULTRA). The results are presented in Table 4-1.

Example 4

Next, the silver-tellurium-coated glass powder of Example 2 was used to produce a conductive paste having a different compositional ratio from that in Example 2. The conductive paste was produced in the same manner as in Example 3 to obtain a conductive paste relating to Example 4. The results of the measured viscosity are presented in Table 4-1.

Comparative Example 3

Next, a conductive paste relating to Comparative Example 3 was obtained in the same manner as in Example 3 except that the tellurium-based glass powder of Comparative Example 1 was used. The results of the measured viscosity are presented in Table 4-1.

Comparative Example 4

Next, a conductive paste relating to Comparative Example 4 was obtained in the same manner as in Example 4 except that the tellurium-based glass powder of Comparative Example 2 was used. The results of the measured viscosity are presented in Table 4-1.

TABLE 4-1

| | | Viscosity (Pa · s) | |
|---|---|---|---|
| | | 1 rpm | 5 rpm |
| Comp. Ex. 3 | Tellurium-based glass powder of Comparative Example 1 | 487 | 135 |
| Ex. 3 | Silver-tellurium-coated glass powder of Example 1 | 419 | 118 |
| Comp. Ex. 4 | Tellurium-based glass powder of Comparative Example 2 | 547 | 124 |

TABLE 4-1-continued

|      |                                             | Viscosity (Pa · s) |       |
|------|---------------------------------------------|--------------------|-------|
|      |                                             | 1 rpm              | 5 rpm |
| Ex. 4 | Silver-tellurium-coated glass powder of Example 2 | 371 | 110 |

It is found from Table 4-1 that the obtained conductive pastes of Examples 3 and 4 tend to be high in viscosity more easily than the conductive pastes of Comparative Examples 3 and 4. It is also found that the conductive pastes of Examples 3 and 4 increase in viscosity (thicken) to a less extent than the conductive pastes of Comparative Examples 3 and 4. In printing with a screen printing machine described below, a resultant printing pattern is more deteriorated as the viscosity is higher. In evaluation of a solar cell, therefore, a solvent (a mixture containing TEXANOL and butyl carbitol acetate at a mass ratio of 1:1) was additionally added to adjust the 5-min values of the viscosities at 1 rpm in Examples 3 and 4 and Comparative Examples 3 and 4 so as to be almost the same values in the viscosity ranges in which printing in the screen printing machine would be optimal (e.g., 320 rpm ±20 rpm). Table 4-2 presents the amounts of the solvent additionally added for the adjustment and the results of the viscosities.

TABLE 4-2

|             | Amount of solvent additionally added for viscosity adjustment (% by mass relative to paste) | Viscosity (Pa · s) |       |
|-------------|---------------------------------------------------------------------------------------------|--------------------|-------|
|             |                                                                                             | 1 rpm              | 5 rpm |
| Comp. Ex. 3 | 0.23                                                                                        | 332                | 120   |
| Ex. 3       | 0.13                                                                                        | 315                | 114   |
| Comp. Ex. 4 | 0.31                                                                                        | 335                | 110   |
| Ex. 4       | 0.12                                                                                        | 329                | 107   |

Next, each of the obtained conductive pastes was used to produce a solar cell in the following manner.

An aluminum paste (manufactured by TOYO ALUMINIUM K. K., ALSOLAR 14-7021) was used to form a solid pattern of 154 mm square on a is back surface of a silicone substrate (105 Ω/sq.) for a solar cell using a screen printing machine (manufactured by Microtrac Co., MT-320T).

A hot air dryer was used for drying at 200° C. for 10 minutes.

Each conductive paste was used to form a finger electrode having a width of 40 μm and three bus bar electrodes on a front surface of the substrate.

A hot air dryer was used for drying at 200° C. for 10 minutes.

A high-speed firing IR furnace (manufactured by NGK INSULATORS, LTD.) was used in high-speed heating for in-out 21 sec with the temperature s upon the peak (firing temperature) being set to 820° C. Through the above procedure, a solar cell was produced.

The produced solar cell was evaluated for solar cell characteristics using a solar simulator manufactured by WACOM Co. The results are presented in Table 5.

TABLE 5

| | Evaluation results of solar cell characteristics | | | | |
|---|---|---|---|---|---|
| | Firing temp. (° C.) | Short-circuit current (A) | Open-circuit voltage (V) | Fill factor (%) | Conversion efficiency (%) | Series resistance (Ω) |
| Comp. Ex. 3 | 820 | 9.28 | 0.626 | 75.82 | 18.11 | 0.0071 |
| Ex. 3 | 820 | 9.28 | 0.629 | 76.32 | 18.31 | 0.0071 |
| Comp. Ex. 4 | 820 | 9.31 | 0.632 | 76.52 | 18.51 | 0.0070 |
| Ex. 4 | 820 | 9.27 | 0.632 | 77.01 | 18.56 | 0.0069 |

It is found from the above that the silver-tellurium-coated glass powders of Examples 3 and 4 can be lowered in viscosity when formed into a paste, as compared with the tellurium-based glass powders of Comparative Examples 3 and 4 having no coating layer. Since the silver-tellurium-coated glass powders of Examples 3 and 4 can be lowered in viscosity, it is possible to avoid reduction in the silver content of the conductive paste for adjustment to an appropriate viscosity. This is also a significant effect in addition to the increase in the conversion efficiency of a solar cell.

Example 5

—Production of Silver-Tellurium-Coated Glass Powder—

A silver-tellurium-coated glass powder relating to Example 5 was obtained in the same manner as in Example 1 except that the tellurium-based glass powder of Example 1 was changed to 10 g of a lead-containing tellurium-based glass powder (containing, for example, Te: 34.8% by mass, Pb: 36.7% by mass, and Bi: 21.0% by mass (as analysis results by X-ray fluorescence)).

The composition analysis of the obtained silver-tellurium-coated glass powder by X-ray fluorescence was performed with an energy dispersive X-ray fluorescence analyzer (JSX-3201 manufactured by JEOL, Ltd.). The results are presented in Table 6. Note that, light elements such as Li are not analyzed by X-ray fluorescence, but Li is contained in the tellurium-based glass powder.

Table 7 presents the measurement results of the particle size distributions and the BET specific surface areas of the obtained silver-tellurium-coated glass powders.

Comparative Example 5

Instead of the silver-tellurium-coated glass powder of Example 5, the lead-containing tellurium-based glass powder (i.e., starting material) described in Example 5 having no coating layer was used as a tellurium-based glass powder in Comparative Example 5. In the same manner as in Example 5, the composition analysis by X-ray fluorescence, the measurement of the particle size distribution, and the measurement of the BET specific surface were performed. The results are presented in Tables 6 and 7.

TABLE 6

| | Composition analysis values (% by mass) | | | | | | |
|---|---|---|---|---|---|---|---|
| | Ag amount | Te amount | Bi amount | Zn amount | Pb amount | Fe amount | Cu amount |
| Comp. Ex. 5 | 5.6 | 34.8 | 21 | 1.5 | 36.7 | 0.3 | 0.1 |
| Ex. 5 | 15.1 | 31.4 | 18.8 | 1.4 | 33 | 0.2 | 0.1 |

TABLE 7

| | Particle size distribution (μm) | | | BET specific surface area |
|---|---|---|---|---|
| | D10 | D50 | D90 | $m^2/g$ |
| Comp. Ex. 5 | 0.8 | 1.8 | 3.4 | 1.56 |
| Ex. 5 | 0.7 | 1.8 | 3.5 | 1.90 |

Further, in the following manners, a conductive paste and a solar cell using the silver-tellurium-coated glass powder relating to Example 5 were produced and evaluated for solar cell characteristics.

<Production of Conductive Paste>

The following components were weighed so as to be 1.80% by mass of the obtained silver-tellurium-coated glass powder (silver content: 15.1% by mass), 90.0% by mass of a silver powder (manufactured by DOWA HIGHTECH CO., LTD., AG-3-8F, a product improved in dispersibility, cumulative 50% point of particle diameter ($D_{50}$)=1.5 μm), 0.41% by mass of a vehicle (ethyl cellulose 10 cps 30% by mass (manufactured by Wako Pure Chemical Industries, Ltd.) butyl carbitol acetate solution), 2.40% by mass of a vehicle (EU-5638, acryl resin 46.1% by mass, butyl carbitol acetate solution, manufactured by NIPPON CARBIDE INDUSTRIES CO., INC.), 3.12% by mass of a solvent (CS-12, manufactured by JMC CO., LTD., TEXANOL), 1.54% by mass of a solvent (manufactured by Wako Pure Chemical Industries, Ltd., butyl carbitol acetate), 0.26% by mass of magnesium stearate (manufactured by Wako Pure Chemical Industries, Ltd.), and 0.51% by mass of oleic acid (manufactured by Wako Pure Chemical Industries, Ltd.). These components were mixed (preliminarily mixed) with a planetary centrifugal stirrer and bubble remover (manufactured by THINKY Corporation, ARE-310), followed by kneading with a triple roll mill (manufactured by EXAKT Co., M-805), to thereby obtain a conductive paste relating to Example 5.

The viscosity of the obtained conductive paste was measured for a 5-min value at 1 rpm and a 1-min value at 5 rpm using a corn plate of CPE-52 in a viscometer (manufactured by Brookfield Co., HBDV-III ULTRA). For viscosity adjustment for adjusting the value of the viscosity at 1 rpm, the above solvent (a mixture containing TEXANOL and butyl carbitol acetate at a mass ratio of 3.12:1.54) was added if necessary, and the viscosity was measured again. The measurement results of the viscosity are presented in Table 8.

<Production of Solar Cell>

An aluminum paste (manufactured by TOYO ALUMINIUM K. K., ALSOLAR 14-7021) was used to form a solid pattern of 154 mm square on a back surface of a silicone substrate (105 Ω/sq.) for a solar cell using a screen printing machine (manufactured by Microtrac Co., MT-320T).

A hot air dryer was used for drying at 200° C. for 10 minutes.

The conductive paste of Example 5 was used to form a finger electrode having a width of 30 μm and four bus bar electrodes on a front surface of the substrate.

A hot air dryer was used for drying at 200° C. for 10 minutes.

A high-speed firing IR furnace (manufactured by NGK INSULATORS, LTD.) was used in high-speed heating for in-out 21 sec with the temperature upon the peak (firing temperature) being set to 760° C., 780° C., or 820° C. Through the above procedure, a solar cell relating to Example 5 was produced. Table 9 presents the results of solar cell characteristics evaluated in the same manner as in Example 1.

Comparative Example 5

<Production of Conductive Paste and Solar Cell>

A conductive paste and a solar cell relating to Comparative Example 5 were produced in the same manner as in Example 5, except that instead of the silver-tellurium-coated glass powder of Example 5, 1.64% by mass of the lead-containing tellurium-based glass powder (i.e., starting material) described in Example 5 having no coating layer, and 90.14% by mass of a silver powder (manufactured by DOWA HIGHTECH CO., LTD., AG-3-8F, a product improved in dispersibility, cumulative 50% point of particle diameter ($D_{50}$)=1.5 μm) were added. Tables 8 and 9 present the viscosities and the evaluation results of solar cell characteristics.

TABLE 8

| | Viscosity (Pa · s) | | Amount of solvent use for viscosity adjustment (% by mass relative to paste) | Viscosity after viscosity adjustment (Pa · s) | |
|---|---|---|---|---|---|
| | 1 rpm | 5 rpm | | 1 rpm | 5 rpm |
| Comp. Ex. 5 | 343 | 89 | 0.17 | 258 | 65 |
| Ex. 5 | 348 | 77 | 0.11 | 258 | 53 |

TABLE 9

| | Firing temp. (° C.) | Short-circuit current (A) | Open-circuit voltage (V) | Fill factor (%) | Conversion efficiency (%) | Series resistance (Ω) |
|---|---|---|---|---|---|---|
| Comp. Ex. 5 | 820 | 9.042 | 0.633 | 78.15 | 18.43 | 0.0069 |
| | 780 | 9.021 | 0.636 | 78.33 | 18.48 | 0.0069 |
| | 760 | 9.138 | 0.636 | 74.27 | 17.76 | 0.0080 |
| Ex. 5 | 820 | 9.035 | 0.634 | 78.88 | 18.60 | 0.0064 |
| | 780 | 9.107 | 0.635 | 78.49 | 18.68 | 0.0065 |
| | 760 | 9.107 | 0.635 | 75.61 | 18.00 | 0.0077 |

Further, the silver-tellurium-coated glass powders of Examples 1, 2, and 5 and the tellurium-based glass powders of Comparative Examples 1, 2, and 5 were measured for L*, a*, and b* in accordance with JIS Z8722 using a color-difference meter (manufactured by NIPPON DENSHOKU INDUSTRIES Co., LTD, color meter ZE6000). The results are presented in Table 10.

TABLE 10

|  | Color difference | | |
| --- | --- | --- | --- |
|  | L* | a* | b* |
| Comp. Ex. 1 | 96.29 | −0.40 | 3.16 |
| Ex. 1 | 51.96 | 1.71 | 5.67 |
| Comp. Ex. 2 | 98.22 | −0.45 | 2.35 |
| Ex. 2 | 54.50 | 0.11 | 3.17 |
| Comp. Ex. 5 | 97.22 | −4.19 | 16.73 |
| Ex. 5 | 52.38 | 0.37 | −0.01 |

INDUSTRIAL APPLICABILITY

The silver-tellurium-coated glass powder of the present invention can be used as a conductive paste for forming electrodes and circuits of various electronic components. In particular, it can be suitably used as a conductive paste for electrodes of solar cells.

The invention claimed is:

1. A silver-tellurium-coated glass powder comprising:
   a tellurium-based glass powder containing tellurium in an amount of 20% by mass or more; and
   a coating layer on a surface of the tellurium-based glass powder, the coating layer containing silver and tellurium as a main component.

2. The silver-tellurium-coated glass powder according to claim 1, wherein the coating layer containing silver and tellurium as a main component further contains a component that is other than silver and tellurium and contained in the tellurium-based glass powder.

3. The silver-tellurium-coated glass powder according to claim 1, wherein the component that is other than silver and tellurium and contained in the tellurium-based glass powder contains one or more kinds selected from zinc, lead, bismuth, silicon, lithium, and aluminum.

4. The silver-tellurium-coated glass powder according to claim 1, wherein a thickness of the coating layer containing silver and tellurium as a main component is 10 nm or more but 400 nm or less.

5. The silver-tellurium-coated glass powder according to claim 1, wherein an oxygen content of the coating layer containing silver and tellurium as a main component is less than an average of an oxygen content of the tellurium-based glass powder to be coated with the coating layer.

6. The silver-tellurium-coated glass powder according to claim 1, wherein when a cross section of the silver-tellurium-coated glass powder is observed after a thermal treatment at 350° C., a silver-rich phase is present inside the silver-tellurium-coated glass powder.

7. The silver-tellurium-coated glass powder according to claim 1, wherein a lightness L* of the silver-tellurium-coated glass powder measured in accordance with JIS Z8722 is 60 or less.

8. A conductive paste comprising:
   the silver-tellurium-coated glass powder according to claim 1.

9. A method for producing a silver-tellurium-coated glass powder, the method comprising:
   adding to a silver complex solution, a tellurium-based glass powder containing tellurium in an amount of 20% by mass or more, and then adding a reducing agent to form on a surface of the tellurium-based glass powder, a coating layer containing silver and tellurium as a main component.

10. The method for producing a silver-tellurium-coated glass powder according to claim 9, wherein the method includes filtrating, washing, drying, and disintegrating after deposition of silver on the surface of the tellurium-based glass powder.

11. A method for producing a conductive paste, the method comprising:
   adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and
   mixing the silver-tellurium-coated glass powder with at least a conductive powder, a resin, and an organic solvent.

12. A method for producing an electrode for a solar cell, the method comprising:
   printing the conductive paste according to claim 8 and firing the conductive paste.

* * * * *